United States Patent [19]
Freeburg et al.

[11] Patent Number: 5,950,118
[45] Date of Patent: Sep. 7, 1999

[54] WIDE BANDWIDTH DISCRIMINATOR FOR USE IN A RADIO RECEIVER

[75] Inventors: Thomas A. Freeburg, Arlington Heights; Irvin Riley Jackson, II, Schaumburg; John Ley, McHenry, all of Ill.

[73] Assignee: Motorola, Inc., Schaumburg, Ill.

[21] Appl. No.: 08/539,458

[22] Filed: Oct. 5, 1995

Related U.S. Application Data

[63] Continuation-in-part of application No. 08/222,062, Apr. 4, 1994, abandoned.

[51] Int. Cl.$^6$ .................................................... H04B 1/16
[52] U.S. Cl. ............................ 455/214; 455/206; 455/303
[58] Field of Search ................................ 455/206, 210, 455/214, 295, 296, 303, 304, 305, 306, 307, 308, 311, 336, 337, 339, 340; 375/346, 349, 350; 329/316, 327, 336

[56] References Cited

U.S. PATENT DOCUMENTS

| | | | |
|---|---|---|---|
| 4,328,591 | 5/1982 | Baghdady | 455/303 |
| 5,339,456 | 8/1994 | Dickerson | 455/303 |

*Primary Examiner*—Thanh Cong Le
*Attorney, Agent, or Firm*—Thomas G. Berry

[57] ABSTRACT

A wide bandwidth frequency discriminator circuit (200) employs a wide bandwidth limiting amplifier (202) to amplify the IF signal portion of a received RF signal. A frequency-to-voltage circuit 208 is provided having a bandwidth substantially greater than the bandwidth of the IF signal. This discriminator (200) operates to form a detection system capable of discriminating between desired and undesired components of the received RF signal even when said desired and undesired components are nearly identical in amplitude. This is due in part to the enhanced frequency response provided by the discriminator (200).

12 Claims, 1 Drawing Sheet

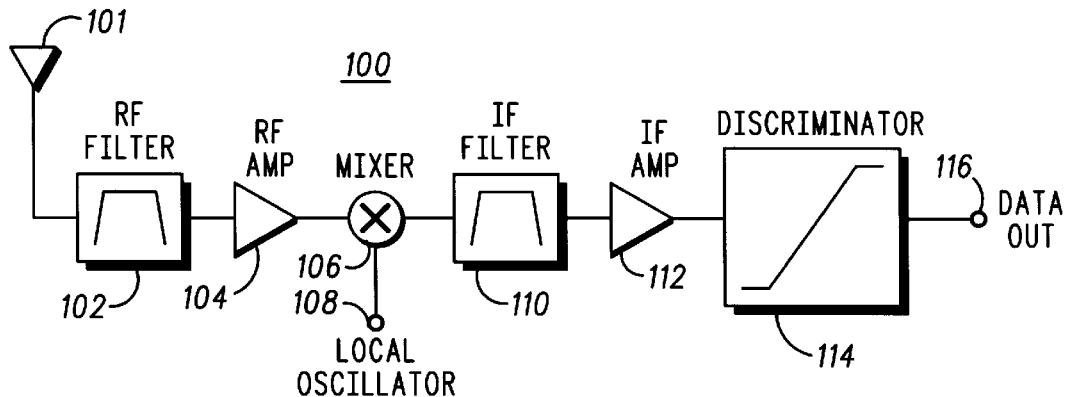
FIG.1 —PRIOR ART—
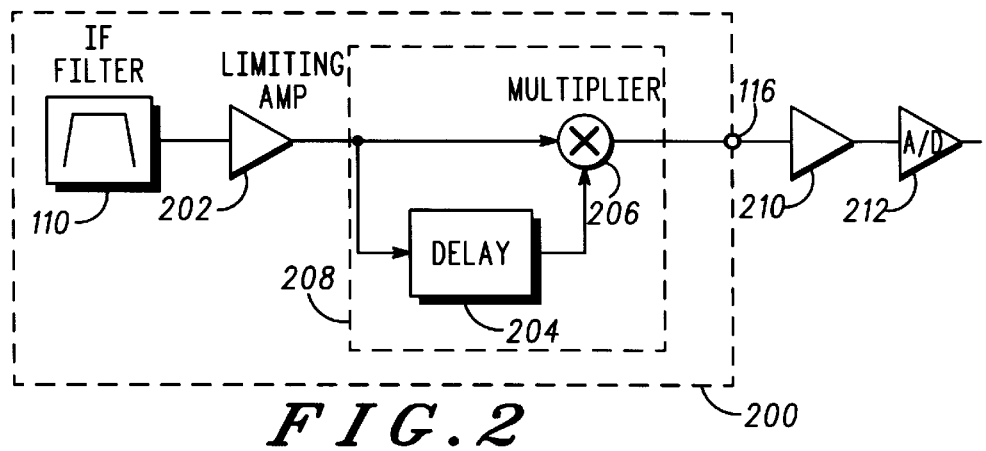
FIG.2
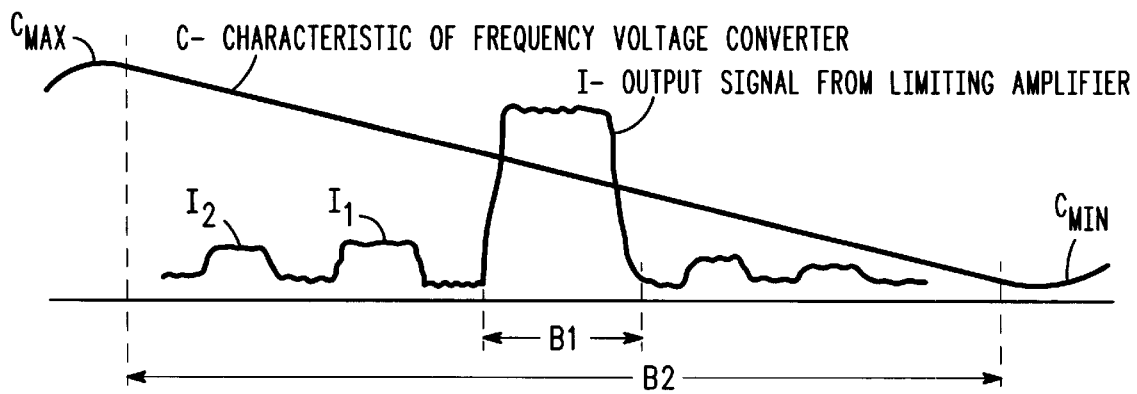
FIG.3

WIDE BANDWIDTH DISCRIMINATOR FOR USE IN A RADIO RECEIVER

This application is a continuation-in-part of application Ser. No. 08/222,062, abandoned, filed Apr. 4, 1994.

FIELD OF THE INVENTION

The present invention is related to radio frequency (RF) receivers and particularly to the construction of discriminator circuits for use in such receivers.

BACKGROUND OF THE INVENTION

RF communication systems employing angle modulation (e.g., frequency modulation (FM) or phase modulation (PM)) for transmission of data, have historically been extremely susceptible to the deleterious effects of co-channel interference. Co-channel interference is caused by the transmission of a signal from a nearby source on the communications channel of concern. As is known, conventional FM receivers suffer from the basic inability to distinguish a desired signal from an undesired signal transmitted by an interfering source, especially when the transmissions are on the same communications channel (i.e., frequency).

In order to overcome this shortcoming and guarantee adequate levels of system performance, communication systems employing FM receivers often require that all such receivers must maintain a predetermined desired signal (i.e., carrier) to interference (C/I) ratio. Typical cellular communication systems, such as the Advanced Mobile Phone Service (AMPS) or Narrow band Advanced Mobile Phone Service (NAMPS) cellular systems deployed by Motorola Inc. require a C/I ratio of at least 18 decibels (dB). While 18 dB of separation between the desired carrier and an interference source is adequate to protect the system from co-channel interference, it nonetheless fails to maximize spectral efficiency, especially when one of the known frequency reuse schemes is also employed by the system in question.

It would be extremely advantageous therefore to provide a radio receiver architecture which operates at a lower C/I separation than is taught by the prior art, in the effort to increase overall spectral efficiency without adversely impacting system performance. Of note, additional information on the AMPS and NAMPS systems has in the past been available by contacting Motorola Inc. at 1303 East Algonquin Road, Schaumburg, Ill. 60196.

SUMMARY OF THE INVENTION

Briefly described the present invention is a wide bandwidth frequency discriminator circuit for use within a radio receiver. The discriminator employs a wide bandwidth limiting amplifier that amplifies the IF signal portion of a received RF signal to provide an amplified output signal. A delay circuit, coupled to the amplifier, provides a delayed representation of the amplified output signal to a multiplier circuit. The multiplier in turn provides a product signal which is the product of the amplified output signal and the delayed representation of the amplified output signal. As will be appreciated, said product signal will be proportional to the phase difference between the amplified output signal and the delayed representation of the amplified output signal.

BRIEF DESCRIPTION OF THE DRAWINGS

FIG. 1 is a block diagram representation of an FM receiver circuit as is known in the art;

FIG. 2 is a block diagram representation of a portion of the FM receiver of FIG. 1 showing the discriminator circuit of the present invention; and FIG. 3 is a frequency-voltage diagram illustrating the operation of the discriminator circuit of FIG. 2.

DESCRIPTION OF A PREFERRED EMBODIMENT

FIG. 1 is a block diagram representation of an FM receiver 100 as is known in the art. For purposes of this discussion, receiver 100 may be divided into a front end section and a back end section. The front end section comprises an antenna 101, RF filter 102, RF amplifier 104, mixer 106, local oscillator 108 and an IF filter 110. The back end section comprises an IF amplifier 112, a discriminator 114 circuit and a output terminal 116.

During operation, RF signals as received by antenna 101, applied to RF filter 102 and amplified by RF amplifier 104 may contain both a desired signal and an interfering signal. The interfering signal will typically exhibit a different amplitude than the desired signal, but the interfering signal and the desired signal may exhibit nearly identical frequencies. The term carrier-to-interference (C/I) ratio is therefore used to characterize the received RF energy and represents the amplitude of the desired signal divided by the amplitude of the interfering signal.

As is known in the art mixer 106 down-converts the received RF signal into an IF signal by mixing it with a signal from local oscillator 108. This IF signal preserves the carrier to interference ratio of the received RF signal, as well as the frequencies of the desired and interfering signals. IF filter 110 provides predetection filtering of all signals falling within the nominal RF bandwidth of the desired ensemble of signals for which the receiver is intended.

Amplifier 112 represents a non linear device which eliminates all amplitude variations in the signal presented, but preserves all phase variations. The amplified IF signal is then passed to discriminator 114 which operates to detect data within the output of the filtered IF signal.

As is known in the art, prior art discriminators are designed to operate at a frequency bandwidth that is nearly identical to the bandwidth of the IF signals upon which they operate. In the presence of interference, however, frequencies outside of the nominal IF bandwidth are typically present at the output of IF amplifier 112. When a narrow band discriminator is employed the high frequency components of these signals are amplitude limited, thereby leaving only the in band (i.e., IF frequency) frequency components. It will be appreciated by those skilled in the art, that these in band frequency components of interference cause the greatest distortion of the desired signal. For further information on this subject the interested reader is referred to Proceedings of the IRE, "Theory of Stronger-Signal Capture in FM Reception" by Elie J. Baghdady, April 1958, pgs. 728–738.

In order to properly detect and discriminate all interference components, the discriminator circuit of the present invention employs a bandwidth that is greater than the bandwidth of those signals present at the output of the IF amplifier 112.

FIG. 2 is a block diagram representation of a portion of the FM receiver 100 of FIG. 1 showing the discriminator circuit 200 of the present invention. The discriminator circuit 200 comprises a wide band limiting amplifier 202, a multiplier 206 and a delay circuit 204. The multiplier 206 and delay circuit 204 together form a voltage-to-frequency converter circuit 208.

At the output 116 of the voltage-to-frequency converter circuit 208 an amplifier 210 is provided, connected in turn to an analog-to-digital converter 212.

During operation, an IF signal from IF filter 110 is applied to the input of the wide band limiting amplifier 202. Such wide band limiting amplifiers are known in the art and require no additional discussion. As previously mentioned, the received IF signal preserves the carrier to interference ratio of the received RF signal, as well as the frequencies of the desired and interfering signals. The amplified output signal of the wide band limiting amplifier 202 has a bandwidth that is at least 3 times the bandwidth of the IF signal itself. This amplified output signal is applied to both the delay circuit 204 and multiplier 206.

The delay circuit 204 is employed to provide a delayed version of the amplified output signal to multiplier 206. In accordance with the present invention delay circuit 204 may comprise any of the known delay devices such as, but not limited to active filters, passive filters, micro strip transmission lines and coaxial cables. Of importance the bandwidth of the delay circuit 204 must be greater than or equal to the bandwidth of those signals present at the output of limiting amplifier 202.

Multiplier 206 provides a product signal which is the product of the amplified output signal and the delayed representation of the amplified output signal of limiting amplifier 202. The amplitude of the product signal is proportional to the phase difference between the amplified and the delayed representation of the amplified output signal. The wide band discriminator of the present invention when used in conjunction with wide band limiting amplifier 202 operates to form a detection system capable of discriminating between a desired and undesired signal even when said signals are nearly identical in amplitude because of the enhanced frequency response provided by discriminator circuit 200.

Of note, the bandwidth of multiplier 206 is at least 3 times greater than the bandwidth of those signals at the output of limiting amplifier 202. While the present invention suggests the use of a multiplier, additional multiplying circuitry including but not limited to: mixers, analog multipliers and digital phase detectors, may be substituted without departing from the spirit of the present invention.

In place of the frequency-to-voltage converter circuit 208, alternative frequency-to-voltage converter circuits could be used, such as a slope detector implemented as a tuned circuit.

Referring to FIG. 3, an example of operation of the discriminator circuit is shown. FIG. 3 shows an output signal I from the limiting amplifier 202. The output signal I has a principal bandwidth B1 equal to the bandwidth of the IF filter 110 and has harmonics I1, I2 etc. extending substantially beyond the bandwidth B1. In the past (as described in Proceedings of the IRE, "Theory of Stronger-Signal Capture in FM Reception" by Elie J. Baghdady, April 1958, pgs. 728–738) it has been the practice to filter out these harmonics, however it is recognised by the present inventors that these harmonics, introduced by the limiter amplifier, contain valuable information which, if utilized, can result in the achievement of improved reception and demodulation in instances of low C/I.

FIG. 3 shows the characteristic C of the frequency-to-voltage converter circuit 208 superimposed on the signal I. It can be seen that the characteristic C has a bandwidth B2 substantially greater than the bandwidth B1 of the IF signal from the IF filter 110. The figure is not to scale. The bandwidth B2 of the frequency-voltage converter circuit 208 is, for example, approximately three or more times the bandwidth B1 of the IF signal from the IF filter 110. Such an arrangement means that the harmonics I1, I2 etc. fall within the turning points Cmax and Cmin of the characteristic C and thus contribute to the output of the discriminator. It is estimated that, with a ratio B2:B1 of approximately 3, a signal can be recovered and demodulated in an environment where the C/I ratio is as low as 6 dB.

In preferred embodiments of the discriminator, the ratio of B2 to B1 is even greater than 3 and is preferably 30 or more. A typical preferred ratio is 40.

An example is now given of a data system employing the invention.

The system of this example has a carrier frequency of 2000 MHz, conveying data at a rate of 10 MHz, i.e. B1 is approximately 10 MHz. A suitable IF frequency is 300 MHz and the selected ratio of B2:B1 is 40, giving B2=400 MHz. To achieve such a wide bandwidth discriminator, a delay line of 0.75 microseconds (one quarter cycle) is used. Such a delay line can be implemented by one of ordinary skill in the art.

Reference can be made to A. Rottinghaus et al. "Highly Linear Broadband Discriminator for Mass Production", Motorola Technical Disclosures Bulletin Volume 23 October 1994 pages 21–25 for certain optional techniques for compensating for bow and tilt in the discriminator 208.

By implementing a very broadband discriminator where B2 is forty times B1, the received signal can be recovered in very low C/I conditions. A C/I ratio of as little as 1 dB can provide a recoverable signal using the present invention.

Because the slope of the characteristic C is low with respect to the frequency variations of the signal I, it is advantageous to provide amplifier 210 at the output 116 of the discriminator before performing analog-to-digital conversion of the output signal in A/D converter 212. Digital filtering techniques can be applied to the output signal after conversion to the digital domain, such as low-pass or rolling-average filtering.

What is claimed is:

1. A frequency discriminator circuit comprising:

an input for receiving an intermediate frequency (IF) signal having a first bandwidth and having modulated data;

a limiting amplifier, coupled to the input, for providing, at an output thereof, an amplified output signal which is amplitude limited and has a second bandwidth at least three times the first bandwidth;

a frequency-to-voltage converter having a frequency-to-voltage characteristic with a substantially linear portion, the substantially linear portion having a bandwidth at least three times the first bandwidth, the frequency-to-voltage converter being coupled to the output of the limiting amplifier for providing an output signal for data recovery.

2. The circuit of claim 1, wherein the frequency-to-voltage converter comprises:

a delay circuit having a bandwidth equal to or greater than the second bandwidth, coupled to the amplifier, for providing a delayed representation of the amplified output signal; and a multiplier, coupled to the amplifier and the delay circuit, for providing a product signal representation of the amplified output signal and the delayed representation of the amplified output signal.

3. The circuit of claim 2 wherein the delay circuit is selected from the group consisting of:
   active filters
   passive filters
   micro strip transmission lines; and
   coaxial cable.

4. The circuit of claim 2 wherein the multiplier is selected from the group consisting of:
   mixers;
   analog multipliers; and
   digital phase detectors.

5. The circuit of claim 2 wherein the product signal is proportional to a phase difference between the amplified output signal and the delayed representation of the amplified output signal.

6. The circuit of claim 5 wherein the product signal has a wide bandwidth frequency response.

7. The circuit of claim 1 wherein the third bandwidth is at least thirty times greater than the first bandwidth.

8. A wide bandwidth frequency discriminator circuit comprising:
   an input for receiving an intermediate frequency (IF) signal having a first bandwidth;
   a limiting amplifier, coupled to the input, for providing an amplified output signal having harmonic components extending substantially outside said first bandwidth;
   a delay circuit having a second bandwidth substantially greater than the first bandwidth, coupled to the amplifier, for providing a delayed representation of the amplified output signal; and
   a multiplier having a third bandwidth equal to or greater than the second bandwidth, coupled to the amplifier and the delay circuit, for providing a product signal representation of the amplified output signal and the delayed representation of the amplified output signal.

9. The circuit of claim 8 wherein the second bandwidth is at least three times greater than the first bandwidth.

10. The circuit of claim 8 wherein the second bandwidth is at least thirty times greater than the first bandwidth.

11. A radio frequency (RF) receiver comprising:
    means for receiving an RF signal comprising data and converting it to an intermediate frequency (IF) signal;
    an IF filter having a first bandwidth, coupled to the receiving means, for filtering the IF signal to remove those components above and below a desired frequency range; and
    an FM discriminator circuit, coupled to the intermediate frequency filter and comprising:
    a limiting amplifier, coupled to the IF filter, for providing an amplified output signal of the filtered IF signal;
    a delay circuit having a second bandwidth at least three times greater than the first bandwidth, coupled to the limiting amplifier, for providing a delayed representation of the amplified output signal; and
    a multiplier having a third bandwidth greater than or equal to the second bandwidth, coupled to the wide bandwidth limiting amplifier and the delay circuit, for providing a product signal having a wide bandwidth frequency response.

12. The radio receiver of claim 11 wherein the product signal amplitude is proportional to a phase difference between the amplified output signal and the delayed representation of the amplified output signal.

* * * * *